United States Patent
Hashimoto

(10) Patent No.: US 10,218,491 B2
(45) Date of Patent: Feb. 26, 2019

(54) RECEIVING CIRCUIT, INTEGRATED CIRCUIT, AND RECEIVING METHOD

(71) Applicant: SOCIONEXT INC., Yokohama-shi, Kanagawa (JP)

(72) Inventor: Tomohiro Hashimoto, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 19 days.

(21) Appl. No.: 15/210,417

(22) Filed: Jul. 14, 2016

(65) Prior Publication Data

US 2016/0323093 A1 Nov. 3, 2016

Related U.S. Application Data

(63) Continuation of application No. PCT/JP2014/075074, filed on Sep. 22, 2014.

(51) Int. Cl.
*H04L 7/00* (2006.01)
*H03L 7/08* (2006.01)
(Continued)

(52) U.S. Cl.
CPC ............... *H04L 7/0029* (2013.01); *H03L 7/07* (2013.01); *H03L 7/08* (2013.01); *H03L 7/0807* (2013.01);
(Continued)

(58) Field of Classification Search
CPC ... H04L 7/0029; H04L 7/0087; H04L 7/0331; H04L 7/033; H03L 7/093; H03L 7/0814;
(Continued)

(56) References Cited

U.S. PATENT DOCUMENTS 6,522,608 B1 2/2003 Kuroda
7,746,971 B2 * 6/2010 Masui .................. H03L 7/0995
375/355
(Continued)

FOREIGN PATENT DOCUMENTS

JP S61-269421 A 11/1986
JP H11-203785 A 7/1999
(Continued)

OTHER PUBLICATIONS

International Search Report of related International Patent Application No. PCT/JP2014/075074 dated Dec. 22, 2014.

*Primary Examiner* — Chieh M Fan
*Assistant Examiner* — Fitwi Y Hailegiorgis
(74) *Attorney, Agent, or Firm* — Arent Fox LLP

(57) ABSTRACT

A receiving circuit includes a deserializer circuit configured to convert serial data to parallel data in accordance with an operating clock, a phase difference detection circuit configured to detect a phase difference between the operating clock and the serial data on the basis of the parallel data, a control circuit configured to determine a phase adjustment amount for shifting a phase of the operating clock by 1 bit of the serial data in accordance with a result of integration of the phase difference when a separation of the parallel data output from the deserializer circuit is not logically correct, and a phase interpolator circuit configured to cause the phase of the operating clock to shift by the 1 bit of the serial data by using the phase adjustment amount in accordance with the result of the integration of the phase difference.

38 Claims, 14 Drawing Sheets

(51) Int. Cl.
*H04L 7/033* (2006.01)
*H03L 7/07* (2006.01)
*H03L 7/081* (2006.01)
*H03L 7/093* (2006.01)
*H03M 9/00* (2006.01)

(52) U.S. Cl.
CPC ............ *H03L 7/0814* (2013.01); *H03L 7/093* (2013.01); *H04L 7/0087* (2013.01); *H04L 7/033* (2013.01); *H04L 7/0331* (2013.01); *H03M 9/00* (2013.01)

(58) Field of Classification Search
CPC ........... H03L 7/0807; H03L 7/07; H03L 7/08; H03M 9/00
USPC ......................................... 375/355, 359, 376
See application file for complete search history.

(56) References Cited

U.S. PATENT DOCUMENTS

| | | | |
|---|---|---|---|
| 2010/0128804 A1* | 5/2010 | Shiran | ..................... H04L 25/14 375/259 |
| 2013/0329754 A1 | 12/2013 | Shin | |
| 2015/0358024 A1* | 12/2015 | Kim | ..................... H03L 7/0807 375/376 |

FOREIGN PATENT DOCUMENTS

| JP | 2008-005044 A | 1/2008 |
|---|---|---|
| JP | 2013-255231 A | 12/2013 |

\* cited by examiner

RECEIVING CIRCUIT, INTEGRATED CIRCUIT, AND RECEIVING METHOD

CROSS-REFERENCE TO RELATED APPLICATIONS

This application is a continuation application of and is claiming benefit under 35 U.S.C. 120 and 365(c) of PCT International Patent Application No. PCT/JP2014/075074 filed on Sep. 22, 2014 and designating the U.S., the entire content of the foregoing application is incorporated herein by reference.

FIELD

The embodiments discussed herein are related to a receiving circuit, an integrated circuit, and a receiving method.

BACKGROUND

In high-speed data transmission used in a Universal Serial Bus (USB), a Serial Advanced Technology Attachment (SATA), and so on between sending and receiving circuits, a clock used for a logical determination (determination of 0 or 1) of the receiving data is restored from the receiving data. In order to correctly perform the logical determination of the receiving data, the phase of the clock restored by the receiving circuit is adjusted by a feedback circuit included inside the receiving circuit so that a phase difference between the phase of the clock and the phase of the receiving data is constant. As such, the clock for the logical determination of the receiving data is reproduced by the receiving circuit, and the sending data is reproduced by performing the logical determination of the receiving data using the reproduced clock. These reproductions are called Clock and Data Recovery (CDR).

Japanese Laid-open Patent Publication No. 11-203785 and Japanese Laid-open Patent Publication No. 61-269421 disclose techniques concerning a phase adjustment.

SUMMARY

According to an aspect of the embodiment, a receiving circuit includes a deserializer circuit configured to convert serial data to parallel data in accordance with an operating clock; a phase difference detection circuit configured to detect a phase difference between the operating clock and the serial data on the basis of the parallel data; a control circuit configured to determine a phase adjustment amount for shifting a phase of the operating clock by 1 bit of the serial data in accordance with a result of integration of the phase difference when a separation of the parallel data output from the deserializer circuit is not logically correct; and a phase interpolator circuit configured to cause the phase of the operating clock to shift by the 1 bit of the serial data by using the phase adjustment amount in accordance with the result of the integration of the phase difference.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

Figure 1:
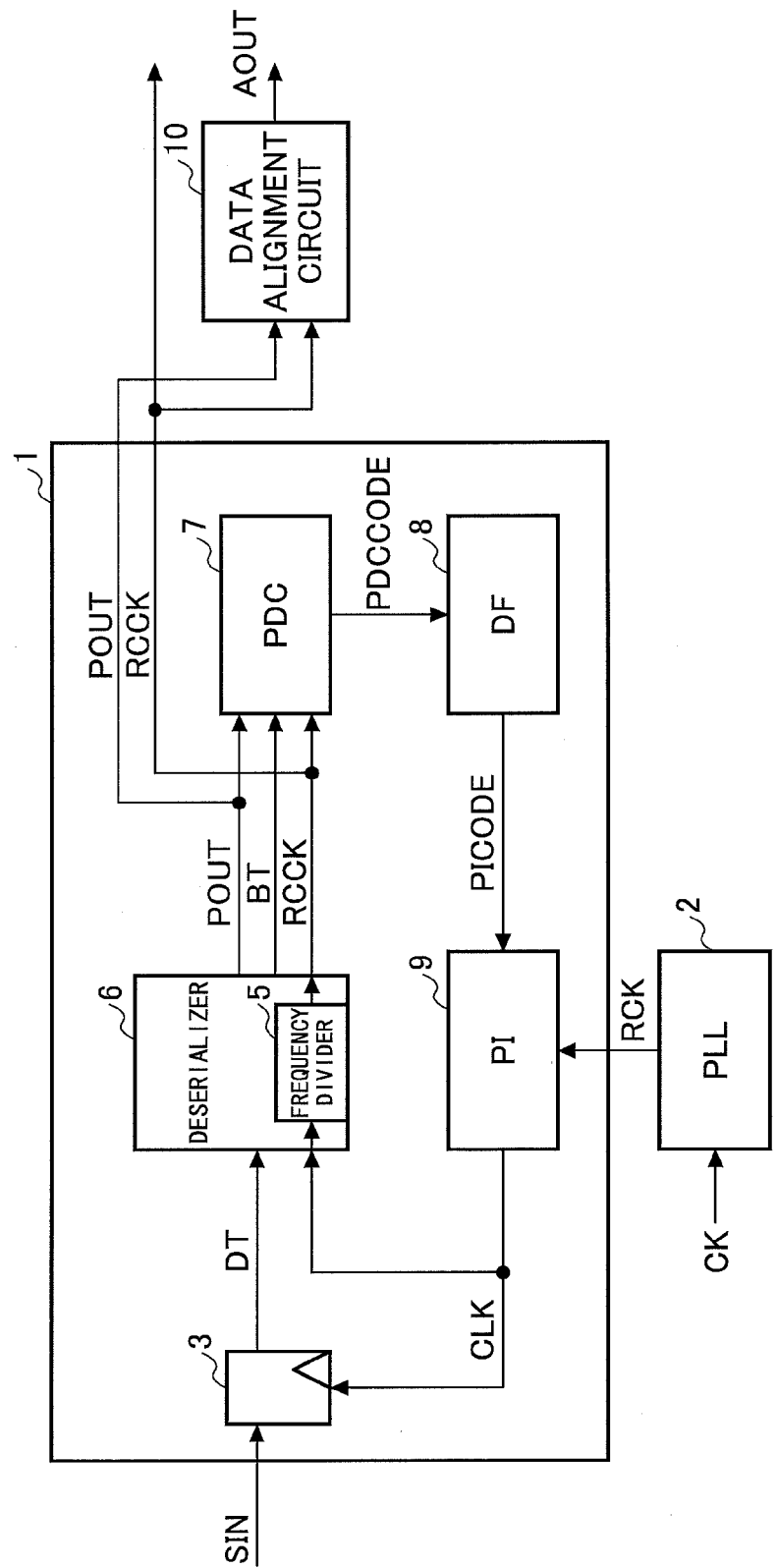
FIG. 1 illustrates a structure of an exemplary receiving circuit.

FIG. 1 illustrates the structure of an exemplary receiving circuit 1 which receives data using the CDR. A latch circuit 3 latches serial data SIN (receiving data) at an edge timing of reaching an edge of an operating clock CLK. A deserializer 6 deserializes output data DT output from the latch circuit 3 to parallel data POUT in conformity with a clock obtained by providing an operating clock CLK with frequency dividing. A phase to digital converter (PDC) 7 compares and processes parallel data output from the deserializer 6 and generates a phase information code PDC-CODE indicating whether the phase of the operating clock CLK advances or delays from the phase of CLK. A digital filter (DF) 8 provides a phase information code PDCCODE output from the PDC 7 with a superposition integral and a time average, and outputs a phase adjustment code PICODE designating a phase shift amount (a phase adjustment amount) of the operating clock CLK. A phase interpolator (PI) 9 outputs an operating clock CLK obtained by providing a reference clock RCK with a phase shift in conformity with the phase adjustment code PICODE. The reference clock RCK is generated by a phase locked loop (PLL) circuit 2 based on a source clock CK.

Because the receiving circuit 1 is structured as described above, the receiving circuit 1 adjusts the phase of the operating clock CLK by a CDR loop including the PI 9 in conformity with a jitter amount contained in the serial data SIN so that a rising edge of the operating clock CLK is positioned in the vicinity of the center of eye pattern of the serial data SIN. With this, the operating clock CLK is reproduced as a clock for logical determination of the serial data SIN, and simultaneously the sending data is reproduced by using the reproduced operating clock CLK.

Meanwhile, the deserializer 6 outputs a clock obtained by providing the operating clock with frequency dividing by the frequency divider 5 as a recovered clock RCCK. The deserializer 6 outputs parallel data POUT together with the recovered clock RCCK to an external circuit on a hierarchy higher than the hierarchy of the receiving circuit 1.

However, the deserializer 6 ordinarily generates the parallel data POUT by separating the serial data to a unit of multiple bits from a timing when a bit lock of the serial data SIN incidentally occurs. Therefore, the external circuit on the hierarchy higher than the hierarchy of the receiving circuit 1 is not informed of which bit has been separated in a bit string of the serial data SIN to parallelize into the parallel data POUT. Therefore, in a case where there is a logical separation in the bit string of the serial data SIN, a data alignment circuit 10 on a hierarchy higher than the hierarchy of the receiving circuit 1 adjusts the position of the parallel data POUT (sorting the parallel data POUT).

Figure 2:
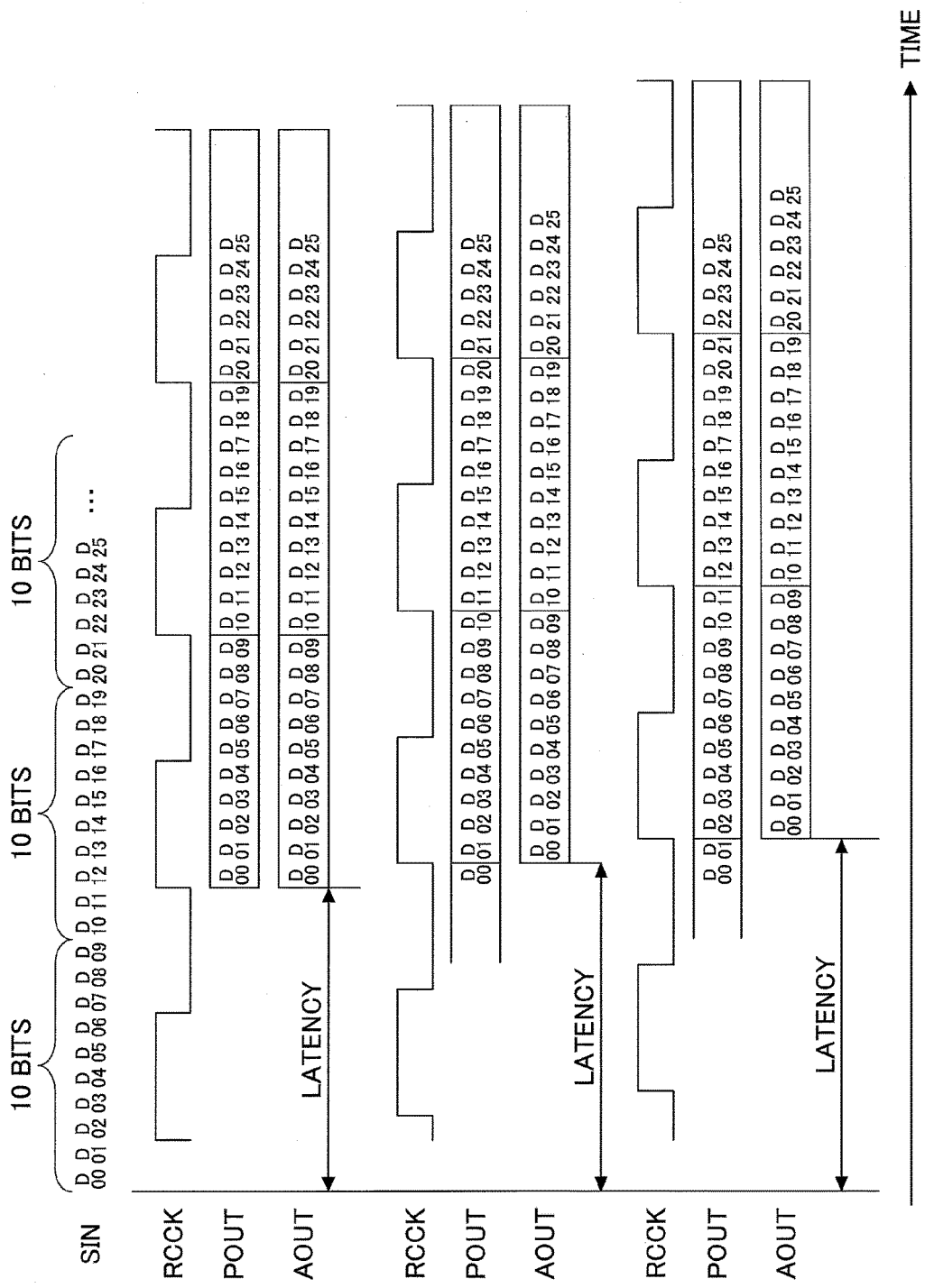
FIG. 2 is a timing chart of an exemplary data alignment method.

FIG. 2 is a timing chart illustrating an exemplary data alignment method using the data alignment circuit 10. For example, in a case where there is a logical separation of a unit of 10 bits, the serial data SIN are deserialized in 10 ways. FIG. 2 illustrates 3 ways among 10 ways. Therefore, there is a probability that there are 10 ways for latencies to occur in alignment data AOUT, which are obtained by aligning the parallel data POUT by the data alignment circuit 10 and outputting by the data alignment circuit 10.

Figure 3:
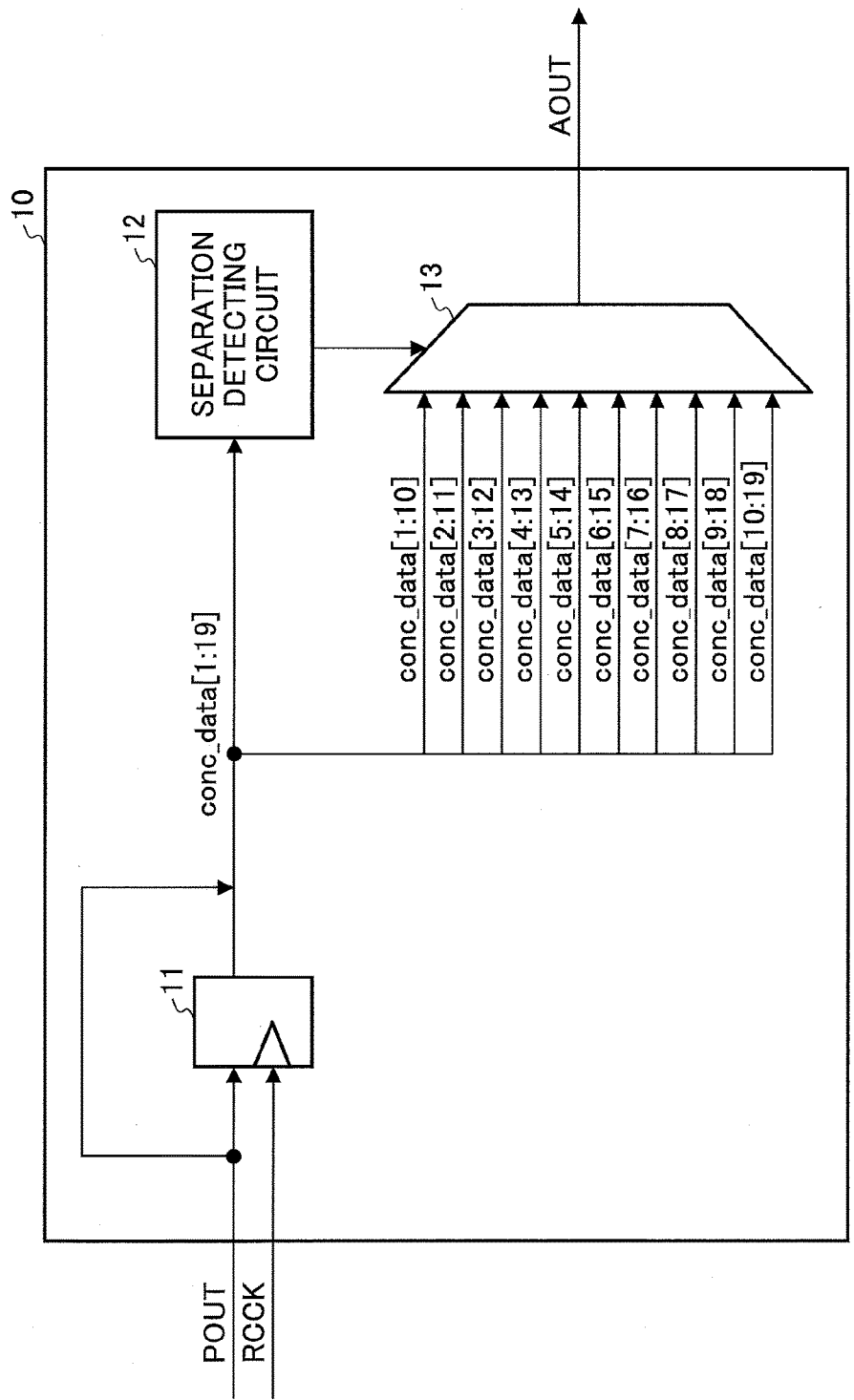
FIG. 3 illustrates a structure of an exemplary data alignment circuit.

As illustrated in, for example, FIG. 3, the data alignment circuit 10 includes a concatenating circuit 11 configured to generate concatenated data conc_data[1:19] by concatenating data of a previous cycle and data of a present cycle, and a separation detecting circuit 12 configured to detect a logical separation from the concatenated data conc_data[1:19]. Then, the data alignment circuit 10 includes a selection circuit 13 configured to select data matching the logical separation detected by the separation detecting circuit 12 from among 10 ways data candidates, which are generated from the concatenated data conc_data[1:19], and output the selected data as the alignment data AOUT, which are aligned.

As described, in a case where a circuit at a later stage of the receiving circuit 1 is not informed of which bit has been separated in a bit string of the serial data SIN to parallelize into the parallel data POUT, a circuit such as the selection circuit 13 is provided. Therefore, the structure of the circuit at the later stage of the receiving circuit 1 becomes complicated.

Preferred embodiments of the present invention will be explained with reference to accompanying drawings. Where the same reference symbols are attached to the same parts, repeated description of the parts is omitted.

Figure 4:
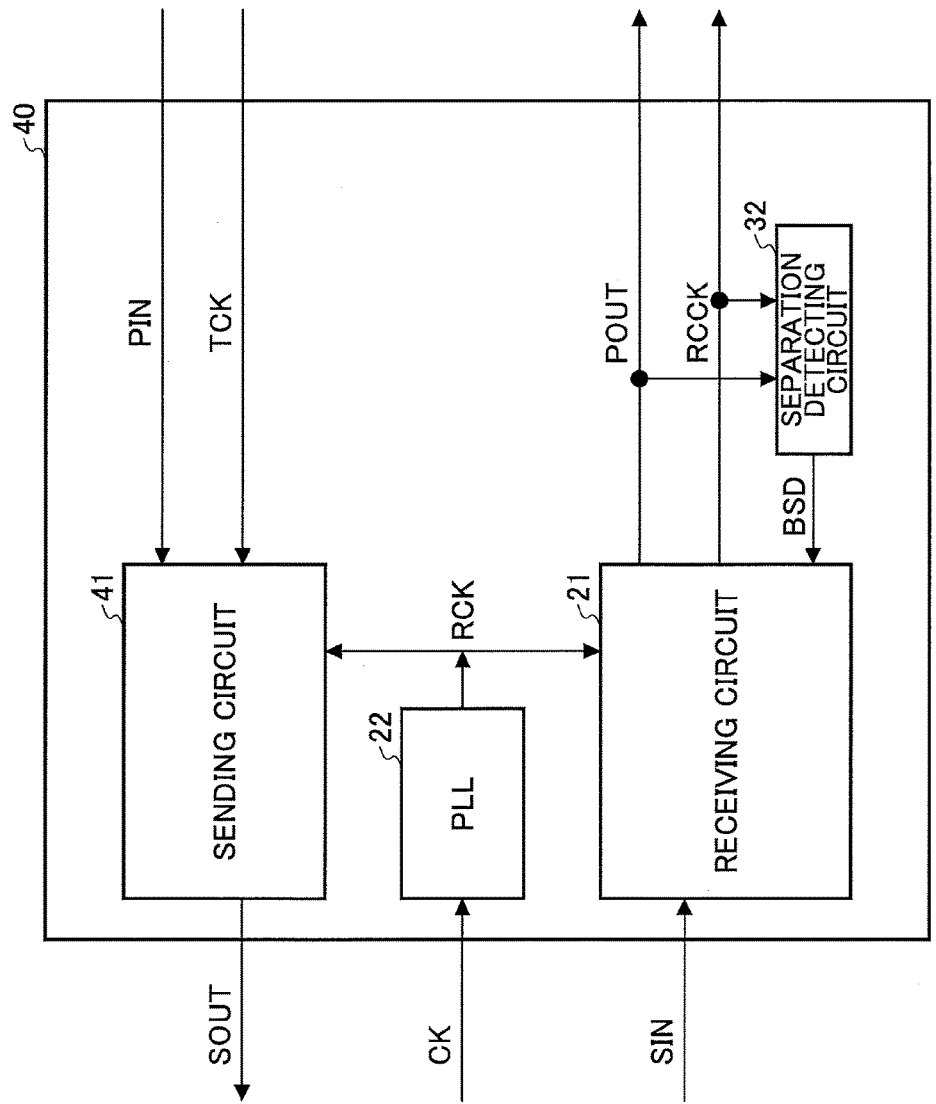
FIG. 4 illustrates a structure of an exemplary integrated circuit including a receiving circuit.

FIG. 4 illustrates a structure of an exemplary integrated circuit 40 including a receiving circuit 21. The integrated circuit 40 is a serializer-deserializer (SerDes) mutually converting the serial data and the parallel data. The integrated circuit 40 includes a PLL 22, a sending circuit 41, a receiving circuit 21, and a separation detecting circuit 32, for example.

The PLL 22 is a clock generation circuit generating a reference clock RCK based on a source clock CK. The PLL 22 outputs the reference clock RCK to the sending circuit 41 and the receiving circuit 21.

The sending circuit 41 is a serializer circuit converting parallel data PIN input together with a transmission clock TCK to serial data SOUT in conformity with the reference clock RCK and outputting the converted serial data SOUT.

The receiving circuit 21 is a deserializer circuit converting the serial data SIN to the parallel data PIN in conformity with the reference clock RCK and outputting the converted parallel data POUT together with the recovered clock RCCK.

The separation detecting circuit 32 detects whether the separation of the parallel data POUT supplied from the receiving circuit 21 is logically correct based on the recovered clock RCCK and the parallel data POUT, which are supplied from the receiving circuit 21. In a case where the parallel data POUT is not output at a separating position which is logically correct, the separation detecting circuit 32 outputs a direction (Bit Shift Direction: BSD) of shifting the phase of the operating clock CLK used inside the receiving circuit 21 one bit of the serial data SIN.

Figure 5:
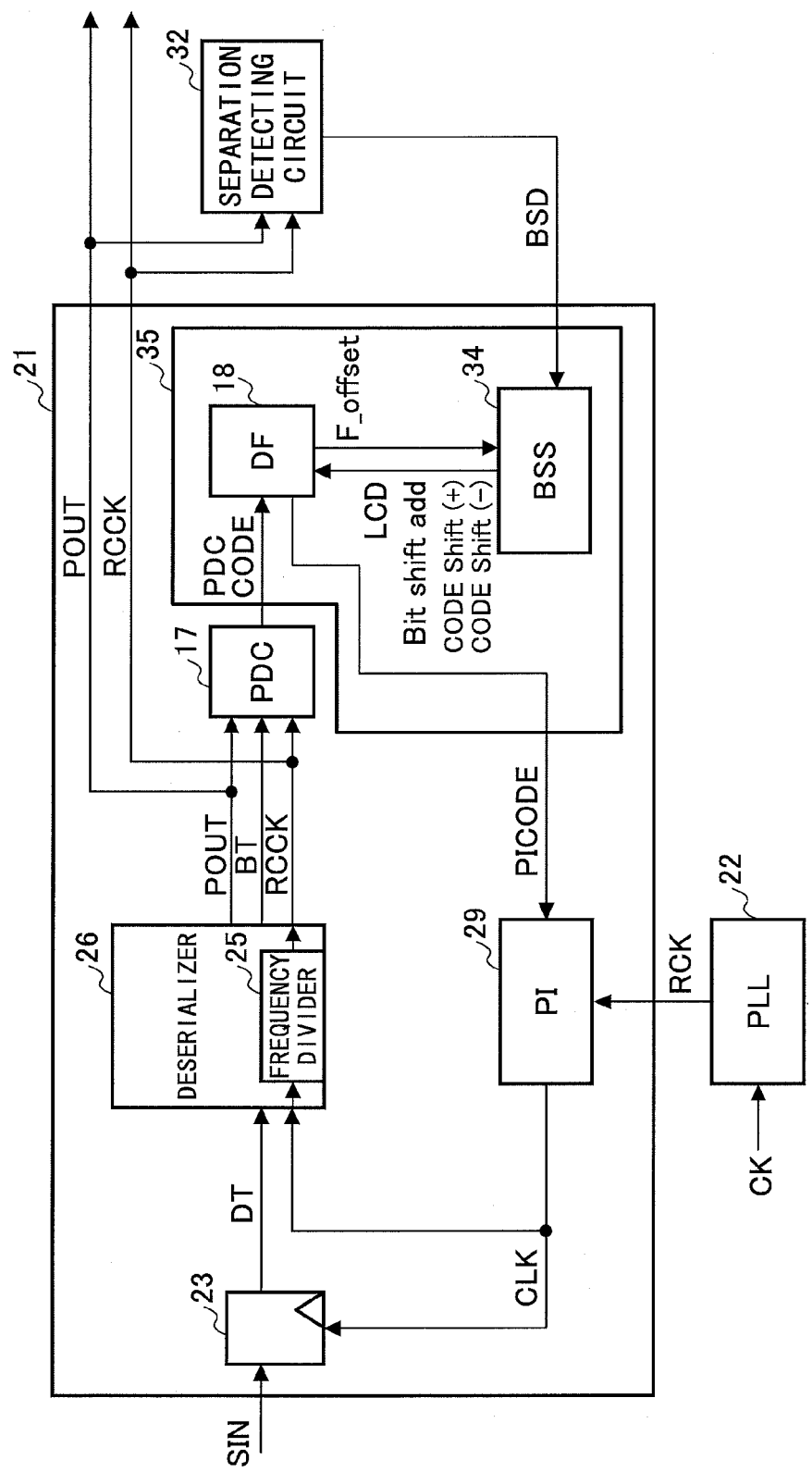
FIG. 5 illustrates a structure of an exemplary receiving circuit.

FIG. 5 illustrates the structure of an exemplary receiving circuit 21 which receives the serial data using the CDR. The receiving circuit 21 includes a latch circuit 23, a frequency divider 25, a deserializer 26, a phase to digital converter (PDC) 17, a control unit 35, and a phase interpolator (PI) 29. The control unit 35 includes a digital filter (DF) 18 and the bit shift sequencer (Bit Shift Sequencer: BSS) 34.

The latch circuit 23 latches the serial data SIN at a timing of the rising edge or the falling edge of the operating clock CLK.

The frequency divider 25 is a circuit which provides the operating clock with the frequency dividing at a predetermined ratio and outputs the recovered clock RCCK that has been provided with the frequency dividing. The recovered clock RCCK is given to the deserializer 26, the PDC 17, and the DF 18 as an operation clock and is transferred to a circuit (e.g., the separation detecting circuit 32) on a latter stage of the receiving circuit 21.

The deserializer 26 is a circuit which converts the serial data SIN to the parallel data POUT in conformity with the operating clock CLK and outputs the converted parallel data POUT. The deserializer 26 deserializes a serial output data DT output from the latch circuit 23 to the parallel data POUT having a predetermined column number (e.g., 16 columns) in conformity with the recovered clock RCCK which has been obtained by providing the operating clock CLK with the frequency dividing by the frequency divider 5. Further, the deserializer 26 detects a boundary of the serial data SIN and outputs boundary detection data BT.

The phase to digital converter (PDC) 17 is an exemplary phase difference detection unit which is a circuit which detects a phase difference between the operating clock CLK and the serial data SIN based on the parallel data POUT. The PDC 17 compares, for example, the parallel data POUT and the boundary detection data BT, which are output from the deserializer 26, and generates a phase information code PDCCODE, which indicates whether the phase of the operating clock CLK advances or delays in comparison with the phase of the serial data SIN, in conformity with the recovered clock RCCK. For example, the PDC 17 quantifies (+1, 0, −1) whether the timing (the sampling timing of the serial data SIN) of the rising edge of the operating clock CLK is earlier or later than a predetermined ideal timing and outputs the quantified timing.

For example, in a case where it is detected that the phase of the operating clock CLK advances in comparison with the phase of the serial data SIN, the phase information code PDCCODE of "−1" indicative of a delay of the phase of the operating clock CLK is output. For example, in a case where it is detected that the phase of the operating clock CLK delays in comparison with the phase of the serial data SIN, the phase information code PDCCODE of "+1" indicative of an advance of the phase of the operating clock CLK is output by the PDC 17. For example, in a case where it is detected that the phase of the operating clock CLK the same as the phase of the serial data SIN, the phase information code PDCCODE of "0" indicative of no adjustment of the phase of the operating clock CLK is output by the PDC 17.

The separation detecting circuit 32 monitors a bit string of the parallel data POUT output from the deserializer 26 and detects whether the separation of the parallel data is logically correct based on the arrangement of the bit string. In a case where the separation detecting circuit 32 detects that the separation of the parallel data POUT is not logically correct, the separation detecting circuit 32 outputs a direction (Bit Shift Direction: BSD) causing the phase of the operating clock CLK to be shifted one bit of the serial data SIN. Until the separation detecting circuit 32 detects that the separation of the parallel data POUT is logically correct, the separation detecting circuit 32 repeatedly outputs the direction BSD causing the phase of the operating clock CLK to be shifted one bit of the serial data SIN.

In the case where the separation detecting circuit 32 detects that the separation of the parallel data POUT is not logically correct, the control unit 35 determines a phase adjustment amount (a phase shift amount) for shifting the phase of the operating clock CLK one bit of the serial data SIN in response to a result of integration of the phase difference detected by the PDC 17. For example, the control unit 3 determines the phase adjustment code PICODE directing the phase adjustment amount in response to the result of the integration of the phase difference detected by the PDC 17 in a case where the control unit 3 receives the direction BSD for shifting the phase of the operating clock CLK one bit of the serial data SIN from the separation detecting circuit 32.

The control unit 35 is a circuit which includes the digital filter (DF) 18 and the bit shift sequencer (Bit Shift Sequencer: BSS) 34.

The digital filter (DF) 18 is a phase adjustment circuit which calculates the result of integration of the phase difference detected by the PDC 17 by providing a superposition integral to the phase information code PDCCODE output from the PDC 17 and obtaining a time average of the result of the superposition integral and outputs the phase adjustment code PICODE directing the phase shift amount (the phase adjustment amount) of the operating clock CLK.

The bit shift sequencer (BSS) 34 is a sequencer circuit which determines a phase correction amount (Bit shift add) applied to the phase adjustment code PICODE based on the result of the integration of the phase difference detected by the PDC 17 in a case where the bit shift sequencer (BSS) 34 receives the direction from the separation detecting circuit 32. The phase difference detected by the PDC 17 is integrated by the DF 18. The result of the integration of the phase difference detected by the PDC 17 is, for example, deviation information (also referred to as a "frequency offset amount F_offset"), which is supplied from the DF 18 to the BSS 34. The DF 18 outputs the phase adjustment code PICODEDF which is corrected using the phase correction amount (Bit shift add) supplied from the BSS 34.

The phase interpolator (PI) 29 is a circuit which causes the phase of the operating clock CLK to be shifted one bit of the serial data SIN in conformity with the phase adjustment code PICODE output from the DF 18 of the control unit 35. The PI 29 outputs the operating clock CLK obtained by providing the reference clock RCK with a phase shift in conformity with the phase adjustment code PICODE.

Because the receiving circuit 21 is structured as described above, the receiving circuit 1 adjusts the phase of the operating clock CLK by a CDR loop including the PI 29 in conformity with a jitter amount contained in the serial data SIN so that the rising edge of the operating clock CLK is positioned in the vicinity of the center of eye pattern of the serial data SIN. With this, the operating clock CLK is reproduced as a clock for logical determination of the serial data SIN, and simultaneously the sending data is reproduced by using the reproduced operating clock CLK.

Further, as described above, the PI 29 causes the phase of the operating clock CLK to be shifted one bit of the serial data SIN in conformity with the phase adjustment code PICODE corrected by the phase correction amount (Bit shift add) supplied from the BSS 34 based on the direction BSD from the separation detecting circuit 32. With this, the separation of the parallel data POUT output from, for example, the deserializer 26 becomes logically correct, and the latency of the parallel data POUT is fixed to be in the fastest state. Therefore, in a circuit in a latter stage receiving the parallel data, the parallel data POUT are not logically correctly arranged. Therefore, the circuit structure in the latter stage 21 of the receiving circuit 21 can be simplified.

Figure 6:
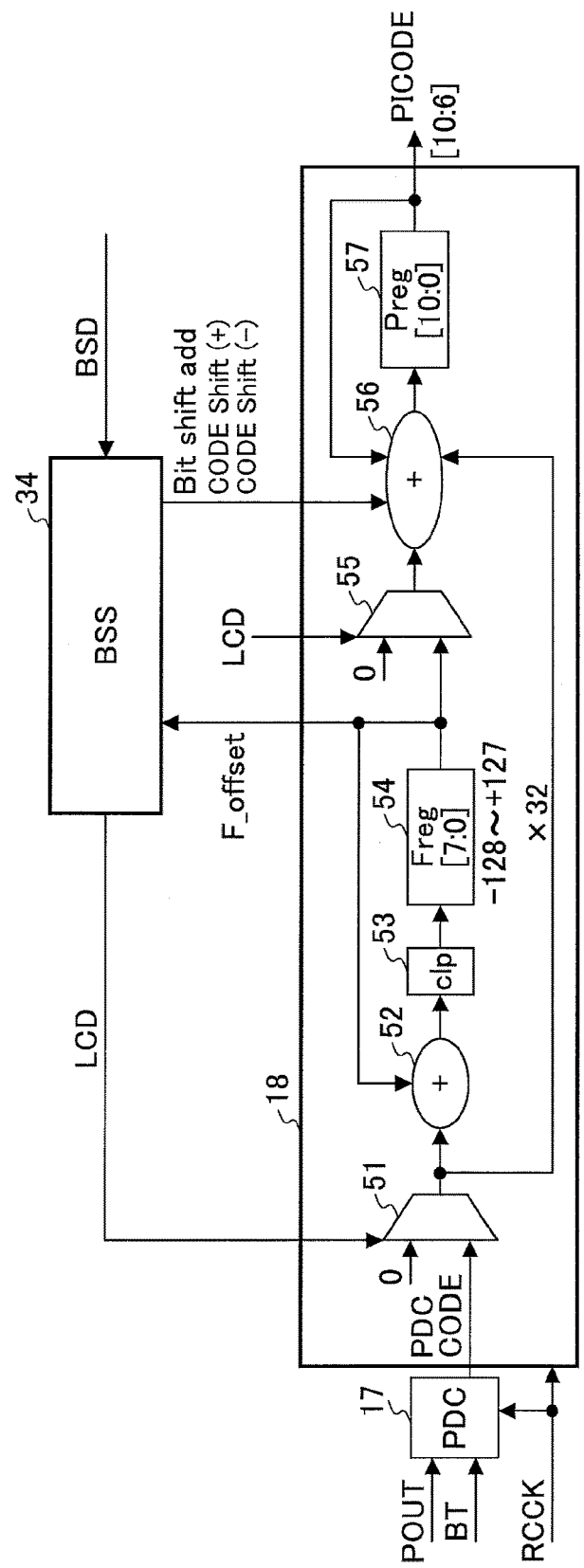
FIG. 6 illustrates a structure of an exemplary digital filter.

FIG. 6 illustrates a structure of the exemplary digital filter 18. For example, the digital filter 18 includes an 8-bit frequency register (Freg[7:0]) 54 and a 11-bit phase register (Preg[10:0]) 57.

The phase information code PDCCODE output from the PDC 17 is integrated by the frequency register 54 using a first stage loop. An integrated value integrated by the frequency register 54 approximates a frequency deviation (i.e., frequency offset amount F_offset) between the serial data SIN and the operating clock CLK. The integrated value of the frequency register 54 is, for example, a signed 8-bit data.

This first stage loop includes an adder 52, a clipper circuit 53, and the frequency register 54. The adder 52 outputs an added value obtained by adding the phase information code PDCCODE to the frequency offset amount F_offset stored in the frequency register 54. The clipper circuit 53 clips the output value from the adder 52 so as to be stored in the frequency register 54.

The phase register 57 included in the second stage loop directs the phase adjustment code PICODE to the PI 29. The second stage loop includes an adder 56 and a phase register 57. The adder 56 outputs an added value of summing the frequency offset amount F_offset, a value obtained by multiplying the phase information code PDCCODE by 32 (32 equals to $2^5$), and the phase correction amount (Bit shift add). The output value from the adder 56 are integrated by the phase register 57. The integrated value obtained by the phase register 57 is an unsigned integer representing the phase.

For example, in a case where the deserializer 26 is a deserializer of 1:10, the higher side 5 bits of the phase register 57 is the phase adjustment code PICODE 57 supplied to the PI 29. A change of the least significant bit of the phase adjustment code PICODE represents the resolution capability of the PI 29. In a case where the phase adjustment code PICODE is 5 bits, the resolution capability of the PI 29 is $\frac{1}{32}$ ($\frac{1}{32}$ equal to $\frac{1}{2^5}$). UI stands for "Unit Interval", which represents a period of 1 bit of the serial data SIN.

Figure 7:
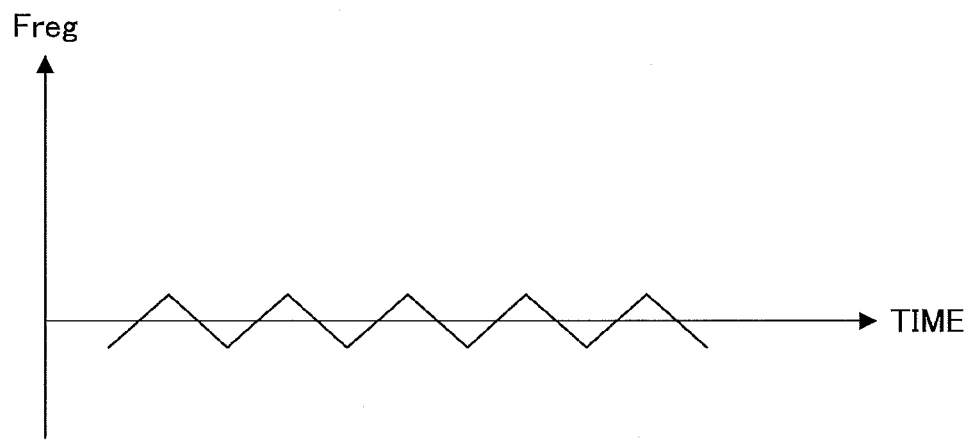
FIG. 7 illustrates an exemplary action of a frequency register.
Figure 8:
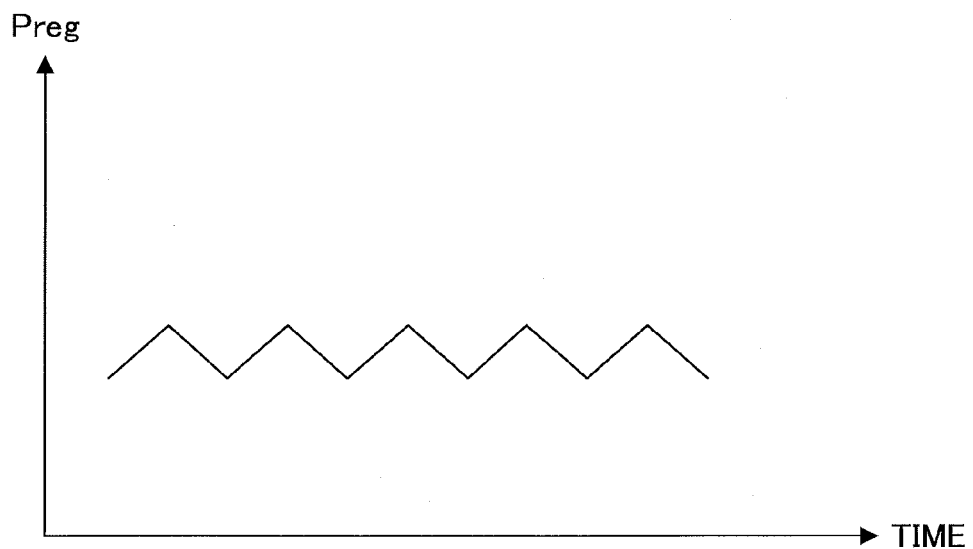
FIG. 8 illustrates an exemplary action of a phase register.

FIG. 7 illustrates an exemplary action of the frequency offset amount F_offset integrated in the frequency register 54 in a case where there is no frequency offset between the serial data SIN and the operating clock CLK. FIG. 8 illustrates an exemplary action of the phase adjustment code PICODE integrated in the phase register 57 in a case where there is no frequency offset between the serial data SIN and the operating clock CLK. In a case where there is no frequency offset, the frequency offset amount F_offset converges into the vicinity of 0 and the phase adjustment code PICODE converges into the vicinity of a certain value.

Figure 9:
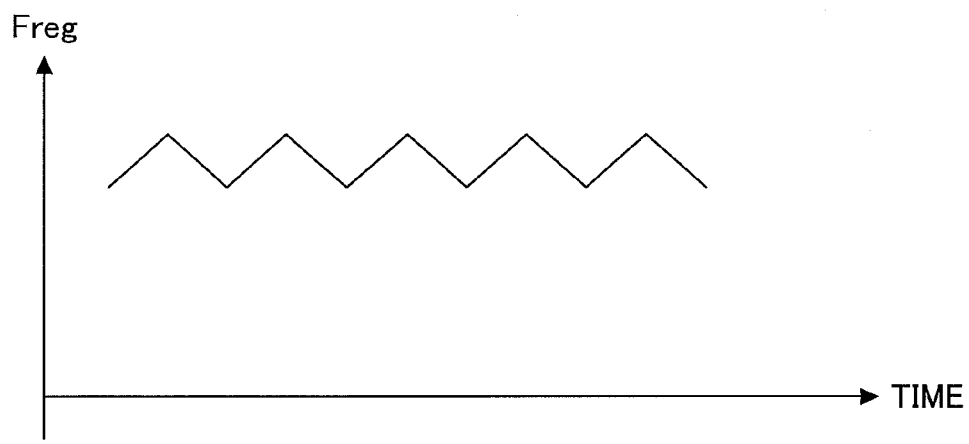
FIG. 9 illustrates an exemplary action of the frequency register.
Figure 10:
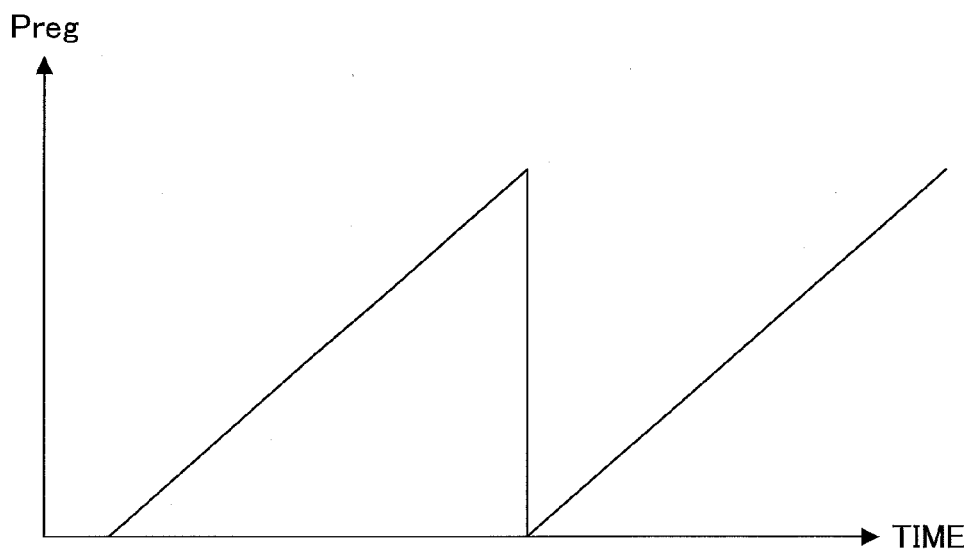
FIG. 10 illustrates an exemplary action of the phase register.

FIG. 9 illustrates an exemplary action of the frequency offset amount F_offset integrated in the frequency register 54 in a case where there is a frequency offset between the serial data SIN and the operating clock CLK. FIG. 10 illustrates an exemplary action of the phase adjustment code PICODE integrated in the phase register 57 in a case where there is a frequency offset between the serial data SIN and the operating clock CLK. When there is a constant frequency offset, the frequency offset amount F_offset converges into a value corresponding to the frequency offset amount, and the phase adjustment code PICODE increases or decreases in a gradient corresponding to the frequency offset amount. Because the phase is indicated by the unsigned integer for the integrated value in the phase register 57, the phase adjustment code PICODE having a width of 5 bits returns to 0 from 31.

Figure 11:
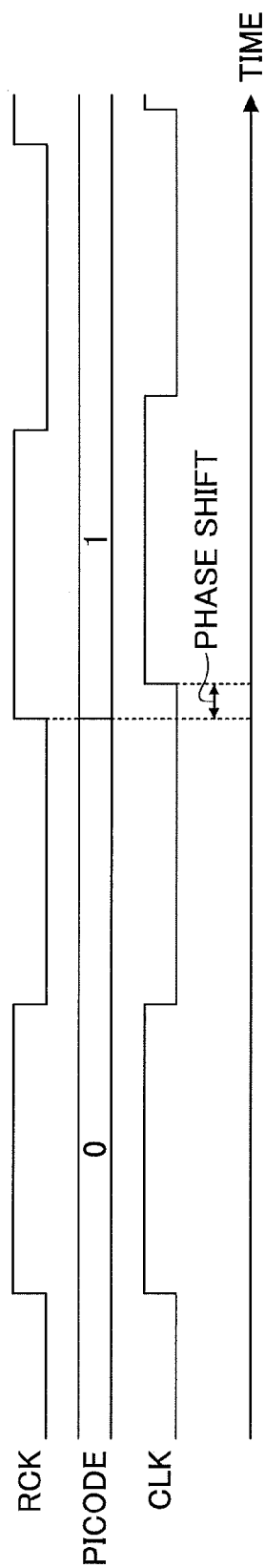
FIG. 11 is a timing chart illustrating an exemplary operation waveform of a phase interpolator.

FIG. 11 is a timing chart illustrating an exemplary operation waveform of the PI 29 which causes the phase of the operating clock CLK to be shifted in conformity with the phase adjustment code PICODE. The PI 29 generates the operating clock CLK obtained by providing the reference clock RCK with a phase shift in conformity with the phase adjustment code PICODE. The latency from a change of the phase adjustment code PICODE to a time when the operating clock CLK reaches the value of the phase adjustment code PICODE depends on the capability of the PI 29.

Figure 12:
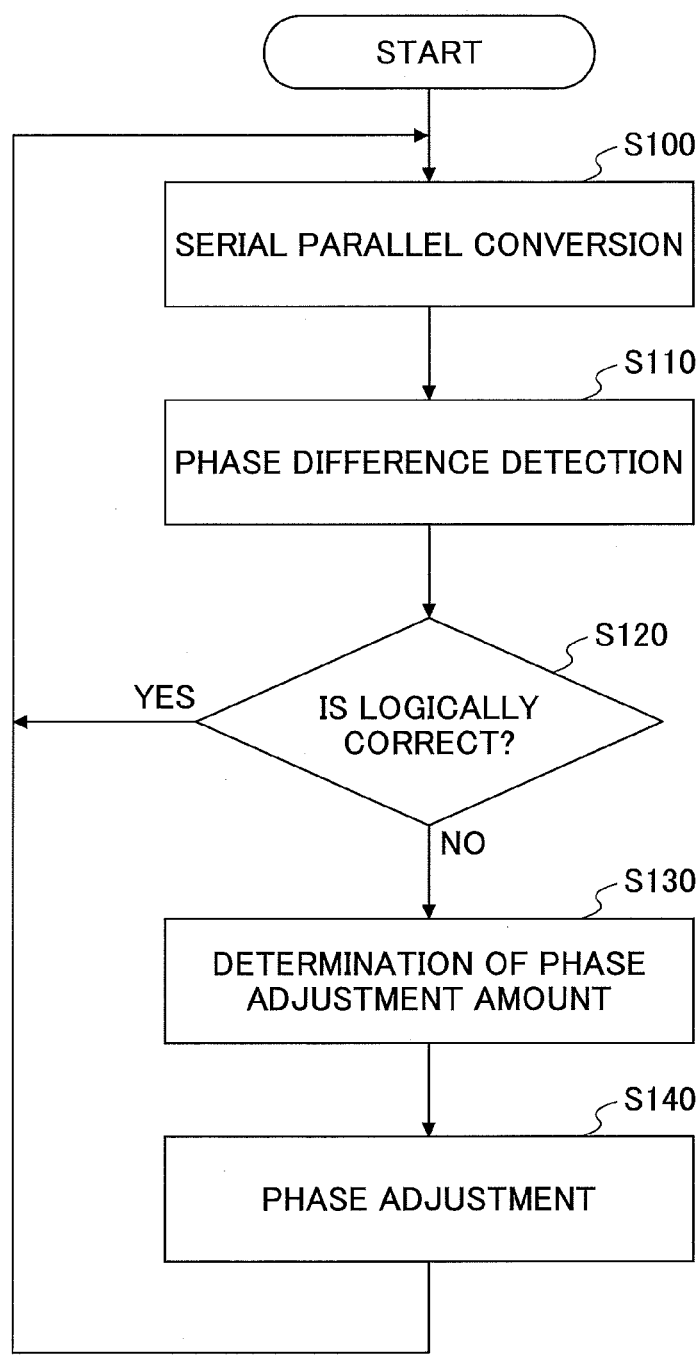
FIG. 12 is a flowchart illustrating an exemplary receiving method.

FIG. 12 is a flowchart illustrating an exemplary receiving method of the serial data SIN. Referring to FIGS. 5-6, FIG. 12 is described.

In step S100, the deserializer 26 converts the serial data SIN to the parallel data POUT in conformity with the operating clock CLK and outputs the converted parallel data POUT. In step S110, the PDC 17 detects the phase difference between the operating clock CLK and the serial data SIN based on the parallel data POUT.

In step S120, the separation detecting circuit 32 determines whether the separation of the parallel data POUT output from the deserializer 26 is logically correct. In a case where the separation detecting circuit 32 detects that the separation of the parallel data POUT is logically correct (YES of step S120), the separation detecting circuit 32 does not output the direction (BSD) causing the phase of the operating clock CLK to be shifted one bit of the serial data SIN. On the other hand, in a case where the separation detecting circuit 32 detects that the separation of the parallel data POUT is not logically correct (NO of step S120), the separation detecting circuit 32 outputs the direction (BSD) causing the phase of the operating clock CLK to be shifted one bit of the serial data SIN.

In step S130, the control unit 35 determines the phase adjustment code PICODE which directs the phase adjustment amount for shifting the phase of the operating clock CLK in response to the frequency offset amount F_offset integrated by the frequency register 54 in receipt of the direction BSD of the bit shift.

In step S140, the PI 29 performs a phase adjustment of causing the phase of the operating clock CLK to be shifted one bit (1 UI) using the phase adjustment code PICODE which is determined by the control unit 35 in response to the frequency offset amount F_offset.

For example, the BSS 34 performs a sequence of shifting one bit using the integrated value (the frequency offset amount F_offset) in the frequency register 54 at the time of receiving the direction BSD upon the receipt of the direction BSD of the bit shift in step S130.

The BSS 34 outputs a Loop Cut Direction (LCD) of causing the integration of the phase information code PDC-CODE into the frequency register 54 to be stopped by a switch 51 (see FIG. 6) when the sequence of shifting one bit is performed. Further, the BSS 34 outputs a loop cut direction LCD of causing the integration of the frequency offset amount F_offset into the phase register 57 to be stopped by a switch 55 (see FIG. 6) when the sequence of shifting one bit is performed. By outputting the loop cut direction LCD, a loop for performing the clock and data recovery (CDR) is cut.

Further, the BSS 34 determines the length of an adjusting notch a for shifting the phase of the operating clock CLK 1 UI in conformity with the size of the integrated value of the frequency register 54 at the time of stopping the integration of the phase information code PDCCODE into the frequency register 54 when the sequence of shifting one bit is performed. The adjusting notch a represents a resolution capability of the phase of the operating clock CLK per one cycle of the recovered clock RCCK. One cycle of the recovered clock RCCK equals to a bit number (a bit width) per one separation of the parallel data POUT.

For example, the BSS 34 makes the adjusting notch a longer when the frequency offset amount F_offset has a positive value and the absolute value of the frequency offset amount F_offset is greater. With this, it is possible to gradually shift the phase of the operating clock CLK 1 UI using the adjusting notch a even though the frequency offset amount F_offset is great. Because the period of the recovered clock RCCK does not greatly change at a time of adjusting the phase of the operating clock CLK, it is possible to prevent the recovered clock RCCK from dropping out.

The BSS 34 causes the adder 56 to integrate the phase correction amount (Bit shift add) into the phase register 57 using the adjusting notch a determined as described above until the phase of the operating clock CLK shifts 1 UI.

Further, the BSS 34 a direction to which the PI 29 shifts the phase of the operating clock CLK in conformity with the size of the integrated value of the frequency register 54 at the time of stopping the integration of the phase information code PDCCODE into the frequency register 54 when the sequence of shifting one bit is performed.

The frequency offset amount F_offset is a positive value when the oscillating frequency of the serial data is greater than the oscillating frequency of the operating clock CLK. The frequency offset amount F_offset is a negative value when the oscillating frequency of the serial data is smaller than the oscillating frequency of the operating clock CLK.

For example, in a case where the frequency offset amount F_offset is a value (including a positive value) greater than a predetermined negative value, the BSS 34 integrates a negative correction amount (CODE Shift(−)) as the phase correction amount (Bit shift add) into the phase register 57 until the phase of the operating clock CLK advances in a forward direction as much as 1 UI.

On the other hand, in a case where the frequency offset amount F_offset is a value smaller than the predetermined negative value, the BSS 34 integrates a positive correction amount (CODE Shift(+)) as the phase correction amount (Bit shift add) into the phase register 57 until the phase of the operating clock CLK advances in the forward direction as much as 1 UI. Said differently, in a case where the frequency offset amount F_offset is a value smaller than the predetermined negative value, the PI 29 causes the phase of the operating clock CLK to be shifted in a direction reverse to the case where the frequency offset amount F_offset is greater than the predetermined negative value. This is because there is a probability that convergence of the frequency offset amount F_offset to zero is not timely caught up by the phase shift in the forward direction in a case where the frequency offset amount F_offset is a negative value and the absolute value of the frequency offset amount F_offset is greater than a predetermined value.

The PI 29 causes the phase of the operating clock CLK to be shifted 1 bit of the serial data SIN in conformity with the phase adjustment code PICODE integrated into the phase register 57 as described above.

As described, the BSS 34 refers to the integrated value of the frequency register 54 at the time of receiving the direction BSD when the sequence of 1 bit shift is performed in receipt of the direction BSD of the bit shift. The BSS 34 determines which sequence for performing the 1 bit shift is adopted using this reference value in conformity with a predetermined method, and directs the loop cut direction LCD and the phase correction amount (Bit shift add) to the DF 18. With this, the PI 29 can perform the sequence of 1 bit shift of the phase of the operating clock CLK in conformity with the integrated value of the frequency register 54 at a time of stopping the integration of the phase information code PDCCODE into the frequency register 54.

The BSS 34 restarts the integration of the phase information code PDCCODE into the frequency register 54 after completing the sequence of 1 bit shift. After restarting the integration of the phase information code PDCCODE into the frequency register 54, the separation detecting circuit 32 monitors the parallel data POUT output from the deserializer 26 again. When the separation detecting circuit 32 determines that the separation of the parallel data POUT is not logically correct again, the separation detecting circuit 32 outputs the direction BSD of the bit shift again. The PI 29 repeatedly perform the sequence of 1 bit shift of the phase of the operating clock CLK in conformity with the integrated value of the frequency register 54 at the time of stopping the integration of the phase information code PDCCODE into the frequency register 54 until it is determined that the separation of the parallel data POUT is logically correct.

Figure 13:
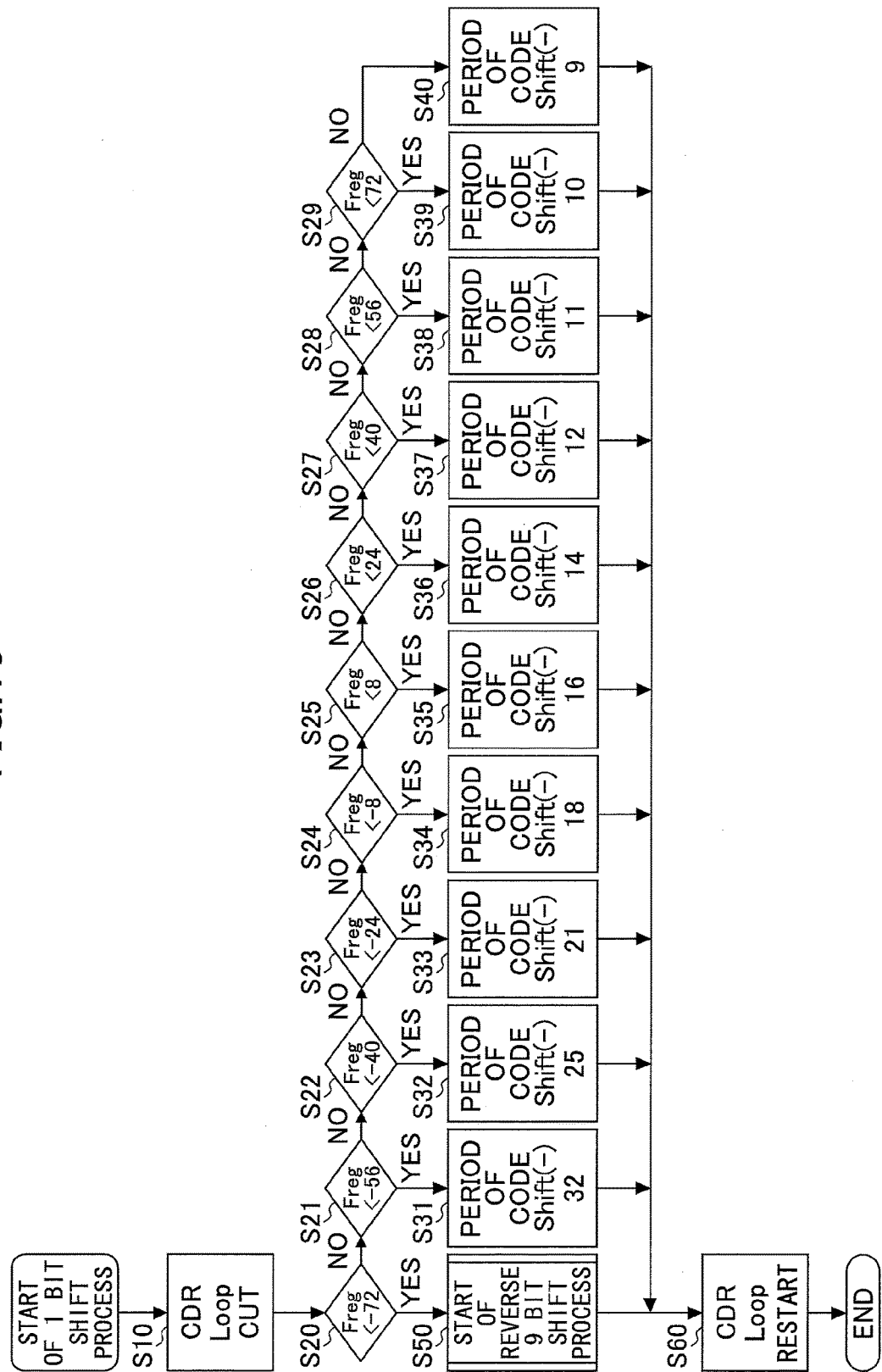
FIG. 13 is a flowchart illustrating an exemplary determination method of determining a phase adjustment amount.

FIG. 13 is a flowchart illustrating an exemplary method of determining the sequence of 1 bit shift by the BSS 34.

When the direction BSD of the bit shift is asserted in step S10, the BSS 34 asserts the loop cut direction LCD and cuts the loop of the CDR as described above.

In steps S20 to S29, the BSS 34 determines a specific sequence action of shifting the phase of the operating clock CLK 1 bit in conformity with the frequency offset amount F_offset which is integrated into the frequency register 54 at the time when the direction BSD of the bit shift is asserted. The BSS 34 determines the specific sequence action from among multiple candidates for the sequence action (steps S50 and S31 to S40).

For example, the BSS 34 shifts the phase of the operating clock CLK 1 UI in conformity with the frequency offset amount F_offset and a code change amount b which can be given to the PI 29 in one cycle of the recovered clock RCCK.

Figure 14:
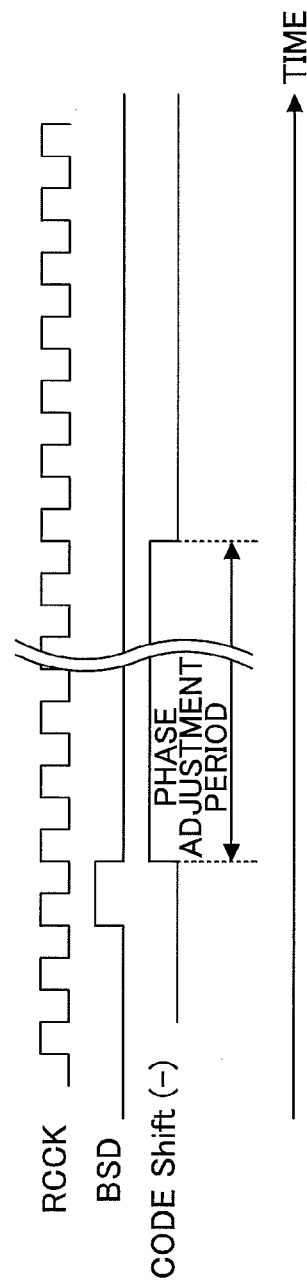
FIG. 14 is a timing chart of an exemplary phase adjustment period.

For example, the BSS 34 causes the phase adjustment period while the negative correction amount (CODE Shift(−)) is integrated into the phase register 57 in conformity with the frequency offset amount F_offset (see FIG. 14) in a case where the positive frequency offset amount F_offset is a positive value or the absolute value of the negative frequency offset amount F_offset is smaller than a code change amount b. Referring to FIG. 13, the case where the positive frequency offset amount F_offset is a positive value or the absolute value of the negative frequency offset amount F_offset is smaller than the code change amount b is a case where any one of steps S21 to S29 is selected. Referring to FIG. 13, "Freg" is the integrated value stored in the frequency register 54 and represents the frequency offset amount F_offset.

In the phase adjustment period while the negative correction amount (CODE Shift(−)) is integrated into the phase register 57, the loop of the CDR is cut and the negative correction amount (CODE Shift(−)) is integrated into the phase register 57 to enable a phase of 2/32 UI to shift within 1 period of the recovered clock RCCK. By considering the frequency offset amount F_offset, the adjusting notch a (an adjustment resolution capability of the phase of the operating clock CLK per 1 period of the recovered clock RCCK) becomes (2/32+the amount determined by considering the frequency offset amount F_offset) UI.

For example, when step S21 is YES (−72≤Freg<−56), the BSS 34 determines the adjusting notch a to be 1/32 UI (1/32 UI=(2/32−(64/64)/32) UI) using a central value of −64. Therefore, the PI 29 can cause the phase of the operating clock CLK to shift 1 UI by multiplying the phase adjustment period as much as 32 periods of the recovered clock RCCK.

In a manner similar thereto, when step S22 is YES (−56≤Freg<−40), the BSS 34 determines the adjusting notch a to be 1.25/32 UI (1.25/32 UI=(2/32−(48/64)/32) UI) using a central value of −48. Therefore, the PI 29 can cause the phase of the operating clock CLK to shift 1 UI by multiplying the phase adjustment period as much as about 25 periods of the recovered clock RCCK.

In a manner similar thereto, when step S28 is YES (40≤Freg<56), the BSS 34 determines the adjusting notch a to be 2.75/32 UI (2.75/32 UI=(2/32+(48/64)/32) UI) using a central value of 48. Therefore, the PI 29 can cause the phase of the operating clock CLK to shift 1 UI by multiplying the phase adjustment period as much as about 11 periods of the recovered clock RCCK.

In step S60, after the phase of the operating clock CLK is shifted 1 UI, the BSS 34 cancels the cut of the loop of the CDR and restarts the integration of the phase information code PDCCODE into the frequency register 54.

Figure 16:
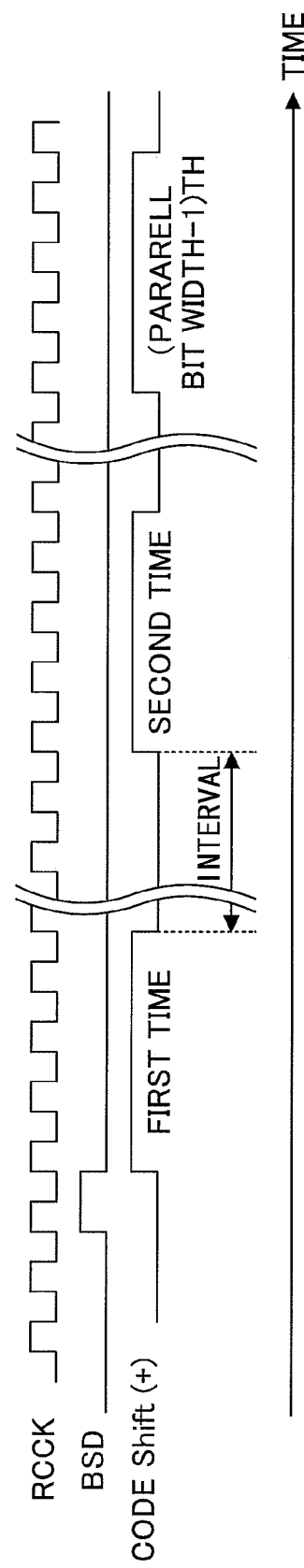
FIG. 16 is a timing chart of an exemplary phase adjustment period.

On the other hand, for example, in the case where the absolute value of the negative frequency offset amount F_offset is greater than the code change amount b, the BSS 34 provides the phase adjustment period while the positive correction amount (CODE shift(+)) is integrated into the phase adjustment period by times of (the bit number per one separation of the parallel data POUT−1)(see FIG. 16). Referring to FIG. 13, the case where the absolute value of the negative frequency offset amount F_offset is greater than the code change amount b is a case where step S20 is YES. In the case where step S20 is YES, the BSS 34 performs a reverse 9 bit shift process.

Figure 15:
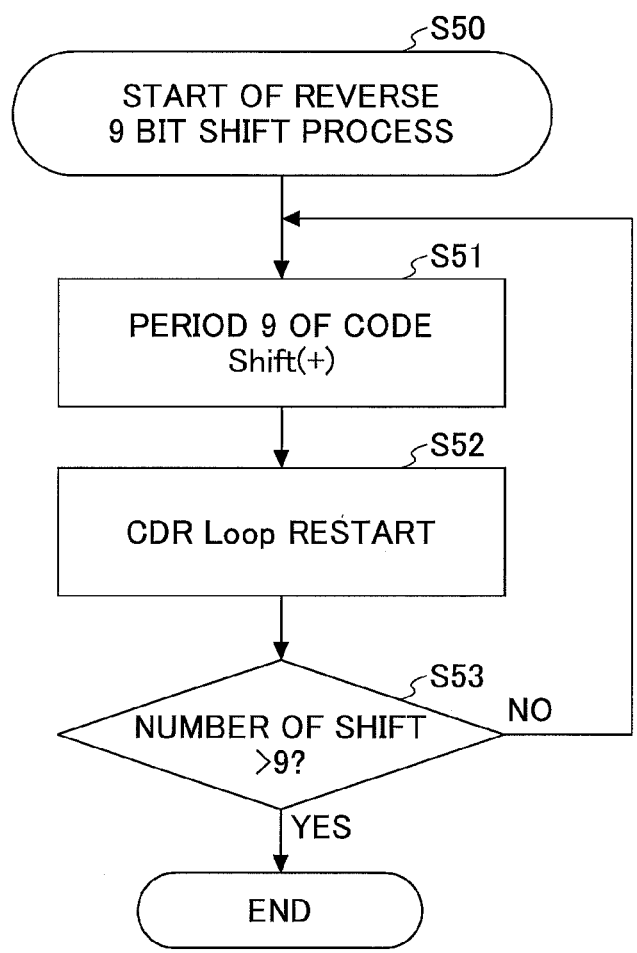
FIG. 15 is a flowchart illustrating an exemplary determination method of determining the phase adjustment amount.

FIG. 15 is a flowchart of an exemplary reverse 9 bit shift process. In the case where the absolute value of the negative frequency offset amount F_offset is greater than the code change amount b, there is a probability that convergence of the frequency offset amount F_offset to zero is not timely caught up by the phase shift in the forward direction. Therefore, the BSS 34 performs the integration of the positive correction amount (CODE Shift(+)) into the phase register 57 9 times. By performing the integration 9 times, 1 bit shift in the forward direction is performed.

In step S51, the BSS 34 determines the adjusting notch a to be 3.25/32 UI (3.25/32 UI=(2/32−(80/64)/32) UI). Therefore, the PI 29 can cause the phase of the operating clock CLK to shift 1 UI by multiplying the phase adjustment period as much as about 9 periods of the recovered clock RCCK. However, if the 9 bit phase shift is performed at once, an error of the frequency offset amount F_offset stored in the frequency register 54 from the actual frequency offset amount becomes great to probably prevent the phase shift as much as 9 UI from being correctly performed.

Therefore, in step S52, the BSS 34 cancels the cut of the loop of the CDR in an interval (see FIG. 16) after the phase shift of 1 UI in step S51, and causes the deserializer 26 to perform a bit lock of the serial data SIN again. In step S53, the BSS 34 repeats the phase shift of 1 bit performed in steps S51 and S52 9 times so as to complete a 1 bit shift in the forward direction. With this, it is possible to prevent the error of the frequency offset amount F_offset stored in the frequency register 54 from the actual frequency offset amount from increasing.

Within the embodiment, the circuit structure in the latter stage of the receiving circuit can be simplified.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A receiving circuit comprising:
   a deserializer circuit configured to convert serial data to parallel data in accordance with an operating clock;
   a phase difference detection circuit configured to detect a phase difference between the operating clock and the serial data on the basis of the parallel data;
   a control circuit configured to determine a phase adjustment amount for shifting a phase of the operating clock by 1 bit of the serial data in accordance with a result of integration of the phase difference when a separation of the parallel data output from the deserializer circuit is not logically correct; and
   a phase interpolator circuit configured to cause the phase of the operating clock to shift by the 1 bit of the serial data by using the phase adjustment amount,
   wherein the control circuit includes
      a phase adjustment circuit configured to calculate the result of the integration of the phase difference by integrating the phase difference, and
      a sequencer circuit configured to determine a phase correction amount for causing the phase of the operating clock to shift by the 1 bit on the basis of the result of the integration of the phase difference when the separation of the parallel data output from the deserializer circuit is not logically correct,
   wherein the phase adjustment circuit is configured to determine the phase adjustment amount based on the result of the integration of the phase difference and the phase correction amount.

2. The receiving circuit according to claim 1,
   wherein the integration of the phase difference is stopped when the separation of the parallel data output from the deserializer circuit is not logically correct,
   wherein the phase interpolator circuit causes the phase of the operating clock to shift by the 1 bit of the serial data by using the phase adjustment amount determined in accordance with the result of the integration at a time of the stop of the integration.

3. The receiving circuit according to claim 2,
   wherein the integration is restarted after the phase of the operating clock shifts by the 1 bit of the serial data.

4. The receiving circuit according to claim 3,
   wherein, when the separation of the parallel data output from the deserializer circuit is not logically correct again after the integration is restarted, the phase interpolator circuit repeatedly causes the phase of the operating clock to shift by the 1 bit of the serial data by using the phase adjustment amount determined in accordance with the result of the integration until it is detected that the separation of the parallel data output from the deserializer circuit is determined to be logically correct.

5. The receiving circuit according to claim 1,
   wherein the control circuit is configured to determine a length of an adjusting notch in which the phase interpolator circuit causes the phase of the operating clock to shift by the 1 bit of the serial data in accordance with the result of the integration.

6. The receiving circuit according to claim 5,
   wherein the control circuit is configured to make the adjusting notch longer as a value of the integration of the phase difference is greater.

7. The receiving circuit according to claim 1,
   wherein the control is configured to change a first direction in accordance with a value of the integration of the phase difference, the phase interpolator circuit being configured to cause the phase of the operating clock to shift in the first direction.

8. The receiving circuit according to claim 7,
   wherein, when the value of the integration is smaller than a first negative value, the phase interpolator circuit is configured to cause the phase of the operating clock to shift in a direction reverse to a direction in a case where the integrated value is greater than the first negative value.

9. The receiving circuit according to claim 1,
   wherein the result of the integration is information indicative of deviation between a frequency of the serial data and a frequency of the operating clock.

10. An integrated circuit comprising:
    a deserializer circuit configured to convert serial data to parallel data in accordance with an operating clock;
    a phase difference detection circuit configured to detect a phase difference between the operating clock and the serial data on the basis of the parallel data;
    a control circuit configured to determine a phase adjustment amount for shifting a phase of the operating clock by 1 bit of the serial data in accordance with a result of integration of the phase difference when a separation of the parallel data output from the deserializer circuit is not logically correct;
    a phase interpolator circuit configured to generate the operating clock on the basis of a reference clock, the phase interpolator circuit being configured to cause the phase of the operating clock to shift by the 1 bit of the serial data by using the phase adjustment amount; and
    a clock generation circuit configured to supply the reference clock to the phase interpolator circuit,
    wherein the control circuit includes
       a phase adjustment circuit configured to calculate the result of the integration of the phase difference by integrating the phase difference, and a sequencer circuit configured to determine a phase correction amount for causing the phase of the operating clock to shift by the 1 bit on the basis of the result of the integration of the phase difference when the separation of the parallel data output from the deserializer circuit is not logically correct, wherein the phase adjustment circuit is configured to determine the phase adjustment amount based on the result of the integration of the phase difference and the phase correction amount.

11. The integrated circuit according to claim 10, the integrated circuit further comprising:

a separation detecting circuit configured to detect whether the separation of the parallel data output from the deserializer circuit is logically correct, wherein the control circuit is configured to determine the phase adjustment amount when the separation of the parallel data output from the deserializer circuit is determined not to be logically correct.

12. A receiving method comprising:

converting serial data to parallel data in accordance with an operating clock;

detecting a phase difference between the operating clock and the serial data on the basis of the parallel data;

determining whether a separation of the parallel data is logically correct;

determining a phase adjustment amount for shifting a phase of the operating clock by 1 bit of the serial data in accordance with a result of integration of the phase difference when the separation of the parallel data is not logically correct; and causing the phase of the operating clock to shift by the 1 bit of the serial data by using the phase adjustment amount, wherein the control circuit includes a phase adjustment circuit configured to calculate the result of the integration of the phase difference by integrating the phase difference, and a sequencer circuit configured to determine a phase correction amount for causing the phase of the operating clock to shift by the 1 bit on the basis of the result of the integration of the phase difference when the separation of the parallel data output from the deserializer circuit is not logically correct, wherein the phase adjustment circuit is configured to determine the phase adjustment amount based on the result of the integration of the phase difference and the phase correction amount.

13. The receiving method according to claim 12, wherein the integration of the phase difference is stopped when the separation of the parallel data is not logically correct, wherein the phase of the operating clock is shifted by the 1 bit of the serial data by using the phase adjustment amount determined in accordance with the result of the integration at a time of the stop of the integration.

14. The receiving method according to claim 13, wherein the integration is restarted after the phase of the operating clock shifts by the 1 bit of the serial data.

15. The receiving method according to claim 14, wherein, when the separation of the parallel data is not logically correct again after the integration is restarted, the phase of the operating clock is repeatedly shifted by the 1 bit of the serial data by using the phase adjustment amount determined in accordance with the result of the integration until it is detected that the separation of the parallel data is determined to be logically correct.

16. The receiving method according to claim 12, wherein a length of an adjusting notch in which the phase of the operating clock is shifted by the 1 bit of the serial data is determined in accordance with the result of the integration.

17. The receiving method according to claim 16, wherein the adjusting notch is made longer as a value of the integration of the phase difference is greater.

18. The receiving method according to claim 12, wherein a first direction is changed in accordance with an integrated value of the phase difference, the phase of the operating clock being shifted in the first direction.

19. The receiving method according to claim 18, wherein, when the value of the integration is smaller than a first negative value, the phase of the operating clock is shifted in a direction reverse to a direction of a case where the value of the integration is greater than a first negative value.

20. A receiving circuit comprising:

a deserializer circuit configured to convert serial data to parallel data in accordance with an operating clock;

a phase difference detection circuit configured to detect a phase difference between the operating clock and the serial data on the basis of the parallel data;

a control circuit configured to determine a phase adjustment amount for shifting a phase of the operating clock by 1 bit of the serial data in accordance with a result of integration of the phase difference when a separation of the parallel data output from the deserializer circuit is not logically correct; and a phase interpolator circuit configured to cause the phase of the operating clock to shift by the 1 bit of the serial data by using the phase adjustment amount, wherein the integration of the phase difference is stopped when the separation of the parallel data output from the deserializer circuit is not logically correct, wherein the phase interpolator circuit causes the phase of the operating clock to shift by the 1 bit of the serial data by using the phase adjustment amount determined in accordance with the result of the integration at a time of the stop of the integration.

21. The receiving circuit according to claim 20, wherein the control circuit includes a phase adjustment circuit configured to calculate the result of the integration of the phase difference by integrating the phase difference, and a sequencer circuit configured to determine a phase correction amount for causing the phase of the operating clock to shift by the 1 bit on the basis of the result of the integration of the phase difference when the separation of the parallel data output from the deserializer circuit is not logically correct, wherein the phase adjustment circuit is configured to determine the phase adjustment amount based on the result of the integration of the phase difference and the phase correction amount.

22. The receiving circuit according to claim 20, wherein the integration is restarted after the phase of the operating clock shifts by the 1 bit of the serial data.

23. The receiving circuit according to claim 22, wherein, when the separation of the parallel data output from the deserializer circuit is not logically correct again after the integration is restarted, the phase interpolator circuit repeatedly causes the phase of the operating clock to shift by the 1 bit of the serial data by using the phase adjustment amount determined in accordance with the result of the integration until it is detected that the separation of the parallel data output from the deserializer circuit is determined to be logically correct.

24. The receiving circuit according to claim 20, wherein the control circuit is configured to determine a length of an adjusting notch in which the phase interpolator circuit causes the phase of the operating clock to shift by the 1 bit of the serial data in accordance with the result of the integration.

25. The receiving circuit according to claim 24, wherein the control circuit is configured to make the adjusting notch longer as a value of the integration of the phase difference is greater.

26. The receiving circuit according to claim 20, wherein the control is configured to change a first direction in accordance with a value of the integration of the phase difference, the phase interpolator circuit being configured to cause the phase of the operating clock to shift in the first direction.

27. The receiving circuit according to claim 26, wherein, when the value of the integration is smaller than a first negative value, the phase interpolator circuit is configured to cause the phase of the operating clock to shift in a direction reverse to a direction in a case where the integrated value is greater than the first negative value.

28. The receiving circuit according to claim 20, wherein the result of the integration is information indicative of deviation between a frequency of the serial data and a frequency of the operating clock.

29. An integrated circuit comprising:
a deserializer circuit configured to convert serial data to parallel data in accordance with an operating clock;
a phase difference detection circuit configured to detect a phase difference between the operating clock and the serial data on the basis of the parallel data;
a control circuit configured to determine a phase adjustment amount for shifting a phase of the operating clock by 1 bit of the serial data in accordance with a result of integration of the phase difference when a separation of the parallel data output from the deserializer circuit is not logically correct;
a phase interpolator circuit configured to generate the operating clock on the basis of a reference clock, the phase interpolator circuit being configured to cause the phase of the operating clock to shift by the 1 bit of the serial data by using the phase adjustment amount; and
a clock generation circuit configured to supply the reference clock to the phase interpolator circuit,
wherein the integration of the phase difference is stopped when the separation of the parallel data output from the deserializer circuit is not logically correct,
wherein the phase interpolator circuit causes the phase of the operating clock to shift by the 1 bit of the serial data by using the phase adjustment amount determined in accordance with the result of the integration at a time of the stop of the integration.

30. The integrated circuit according to claim 29, the integrated circuit further comprising:
a separation detecting circuit configured to detect whether the separation of the parallel data output from the deserializer circuit is logically correct,
wherein the control circuit is configured to determine the phase adjustment amount when the separation of the parallel data output from the deserializer circuit is determined not to be logically correct.

31. A receiving method comprising:
converting serial data to parallel data in accordance with an operating clock;
detecting a phase difference between the operating clock and the serial data on the basis of the parallel data;
determining whether a separation of the parallel data is logically correct;
determining a phase adjustment amount for shifting a phase of the operating clock by 1 bit of the serial data in accordance with a result of integration of the phase difference when the separation of the parallel data is not logically correct; and
causing the phase of the operating clock to shift by the 1 bit of the serial data by using the phase adjustment amount,
wherein the integration of the phase difference is stopped when the separation of the parallel data output from the deserializer circuit is not logically correct,
wherein the phase interpolator circuit causes the phase of the operating clock to shift by the 1 bit of the serial data by using the phase adjustment amount determined in accordance with the result of the integration at a time of the stop of the integration.

32. The receiving method according to claim 31, wherein the integration of the phase difference is stopped when the separation of the parallel data is not logically correct,
wherein the phase of the operating clock is shifted by the 1 bit of the serial data by using the phase adjustment amount determined in accordance with the result of the integration at a time of the stop of the integration.

33. The receiving method according to claim 32, wherein the integration is restarted after the phase of the operating clock shifts by the 1 bit of the serial data.

34. The receiving method according to claim 33, wherein, when the separation of the parallel data is not logically correct again after the integration is restarted, the phase of the operating clock is repeatedly shifted by the 1 bit of the serial data by using the phase adjustment amount determined in accordance with the result of the integration until it is detected that the separation of the parallel data is determined to be logically correct.

35. The receiving method according to claim 31, wherein a length of an adjusting notch in which the phase of the operating clock is shifted by the 1 bit of the serial data is determined in accordance with the result of the integration.

36. The receiving method according to claim 35, wherein the adjusting notch is made longer as a value of the integration of the phase difference is greater.

37. The receiving method according to claim 31, wherein a first direction is changed in accordance with an integrated value of the phase difference, the phase of the operating clock being shifted in the first direction.

38. The receiving method according to claim 37, wherein, when the value of the integration is smaller than a first negative value, the phase of the operating clock is shifted in a direction reverse to a direction of a case where the value of the integration is greater than a first negative value.

* * * * *